US005691720A

United States Patent [19]

Wang et al.

[11] Patent Number: 5,691,720
[45] Date of Patent: Nov. 25, 1997

[54] DELTA SIGMA ANALOG-TO-DIGITAL CONVERTER HAVING PROGRAMMABLE RESOLUTION/BIAS CURRENT CIRCUITRY AND METHOD

[75] Inventors: Binan Wang; Timothy V. Kalthoff; Miaochen Wu, all of Tuscon, Ariz.

[73] Assignee: Burr-Brown Corporation, Tucson, Ariz.

[21] Appl. No.: 613,112

[22] Filed: Mar. 8, 1996

[51] Int. Cl.[6] .................................................. H03M 3/00
[52] U.S. Cl. .......................... 341/143; 341/155; 341/118; 341/172
[58] Field of Search ..................... 341/143, 155, 341/172, 118

[56] References Cited

U.S. PATENT DOCUMENTS

| | | | |
|---|---|---|---|
| 4,935,703 | 6/1990 | Poletto | 330/255 |
| 5,045,717 | 9/1991 | Moen, Jr. et al. | 307/296.3 |
| 5,157,395 | 10/1992 | Del Signore et al. | 341/143 |
| 5,410,310 | 4/1995 | Molnar | 341/143 |
| 5,461,381 | 10/1995 | Seaberg | 341/143 |
| 5,610,604 | 3/1997 | Leacock et al. | 341/138 |

*Primary Examiner*—Jeffrey A. Gaffin
*Assistant Examiner*—Jason L. W. Kost
*Attorney, Agent, or Firm*—Cahill, Sutton & Thomas P.L.C.

[57] ABSTRACT

Programmable resolution/bias current control circuitry is provided in a delta sigma analog-to-digital converter including an input sampling circuit, a feedback reference sampling circuit, an integrator including an operational amplifier, a comparator, and a digital filter, the input sampling circuit and the feedback reference sampling circuit being coupled to a first input of the operational amplifier, an output of the operational amplifier being coupled to an input of the comparator, an output of the comparator being coupled to an input of the digital filter. The programmable resolution/bias control circuitry includes a clock generator circuit supplying a clock signal to the input sampling circuit and the feedback sampling circuit at a sampling frequency determined by a sampling frequency control signal. A bias current generator circuit supplies a bias current to the operational amplifier to control the settling time of an output step voltage signal produced by the operational amplifier. A control circuit receives a resolution control signal and changes both the sampling frequency control signal and a bias control signal in response to the resolution control signal so as to achieve a predetermined tradeoff between resolution of the digital output and dc power dissipation of the analog-to-digital converter.

20 Claims, 2 Drawing Sheets

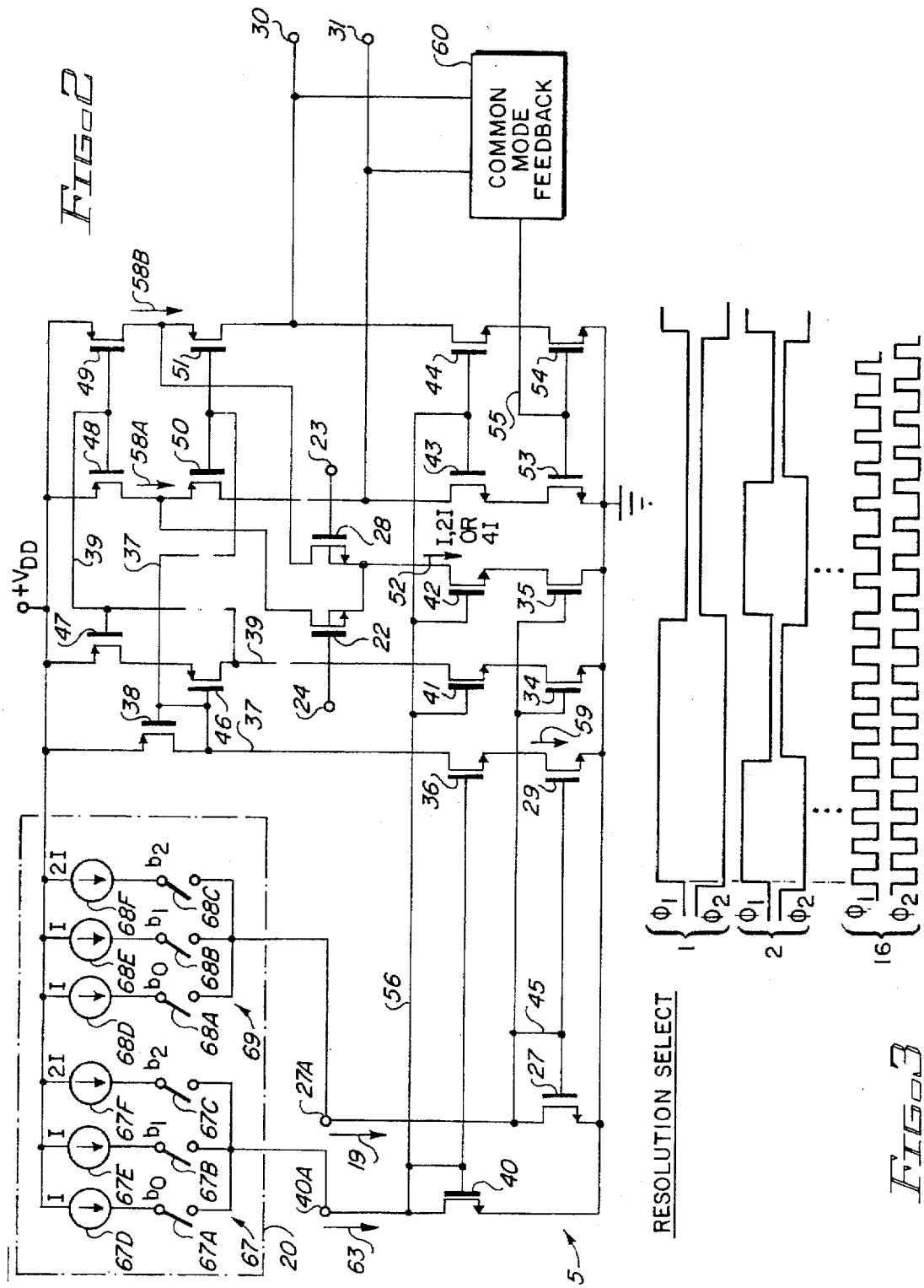

5,691,720

DELTA SIGMA ANALOG-TO-DIGITAL CONVERTER HAVING PROGRAMMABLE RESOLUTION/BIAS CURRENT CIRCUITRY AND METHOD

BACKGROUND OF THE INVENTION

The invention relates to analog-to-digital converters, more particularly to delta sigma analog-to-digital converters, and still more particularly to circuitry for providing a programmable tradeoff between optimum dc power dissipation and resolution of the digital output of the delta sigma analog-to-digital converter.

The closest known prior art analog-to-digital converters, especially prior art delta sigma analog-to-digital converters, are designed to have a particular resolution at a particular operating frequency or digital output data update frequency. Generally, if high resolution is desired, it is necessary to design the operational amplifier of the integrator so that it operates with a short output settling time. This requires designing the operational amplifier to have a fast settling time, or equivalently, a fast "slew rate" and a high bandwidth; this results in high power dissipation in the operational amplifier.

Although it is well known to those skilled in the art that increasing the maximum speed of operation of almost any electronic circuit generally requires increasing the power dissipation of that circuit, the applicants know of no prior analog-to-digital converter, especially a delta sigma analog-to-digital converter, in which the maximum resolution achievable with optimum power dissipation is programmable.

In an analog-to-digital converter described in U.S. Pat. 5,157,395 (Del Signore et al.) assigned to Crystal Semiconductor, the resolution of the digital output signal is changed by changing the decimation ratio of a digital decimation filter coupled to the output of the delta sigma modulator. In effect, this approach "trades off" between the digital data output update rate and the resolution of the digital data output.

SUMMARY OF THE INVENTION

Accordingly, it is an object of the invention to provide adjustable high resolution of the digital output of an analog-to-digital converter while avoiding excessive power dissipation during low resolution operation of the analog-to-digital converter.

It is another object of the invention to provide adjustable high resolution of the digital output of a delta sigma analog-to-digital converter while avoiding excessive power dissipation during low resolution operation of the delta sigma analog-to-digital converter.

It is another object of the invention to provide a user of an analog-to-digital converter the flexibility of programming the resolution of the digital output of the analog-to-digital converter with automatic modification of dc power dissipation in the analog-to-digital converter such that the power dissipation of the analog-to-digital converter is commensurate with the selected resolution.

Briefly described, and in accordance with one embodiment thereof, the invention provides a delta sigma analog-to-digital converter including an input sampling circuit, a feedback reference sampling circuit, an integrator including an operational amplifier, a comparator, and a digital filter, the input sampling circuit and the feedback reference sampling circuit being coupled to a first input of the operational amplifier, an output of the operational amplifier being coupled to an input of the comparator, an output of the comparator being coupled to an input of the digital filter, and programmable resolution control circuitry. The programmable resolution control circuitry includes a clock generator circuit supplying a clock signal to the input sampling circuit and the feedback sampling circuit at a sampling frequency determined by a sampling frequency control signal. A bias current generator circuit supplies a bias current to the operational amplifier to control the settling time of an output step voltage signal produced by the operational amplifier. A control circuit receives a resolution control signal and produces both the sampling frequency control signal and a bias control signal in response to the resolution control signal. The clock generator circuit operates in response to the sampling frequency control signal to increase the sampling frequency in response to an increase in the value of the resolution control signal. The bias current generator circuit operates in response to the bias current control signal to increase bias current supplied to the operational amplifier in response to an increase in the value of the resolution control signal.

BRIEF DESCRIPTION OF THE DRAWINGS

FIG. 2 is a schematic circuit diagram of the operational amplifier of the integrator in the delta sigma analog-to-digital converter of FIG. 1 combined with a programmable bias control circuit that operates in accordance with resolution control information indicated in Table 1.

FIG. 3 is a timing diagram useful in describing the circuits of FIGS. 1 and 2.

DETAILED DESCRIPTION OF THE PREFERRED EMBODIMENTS

Figure 1:
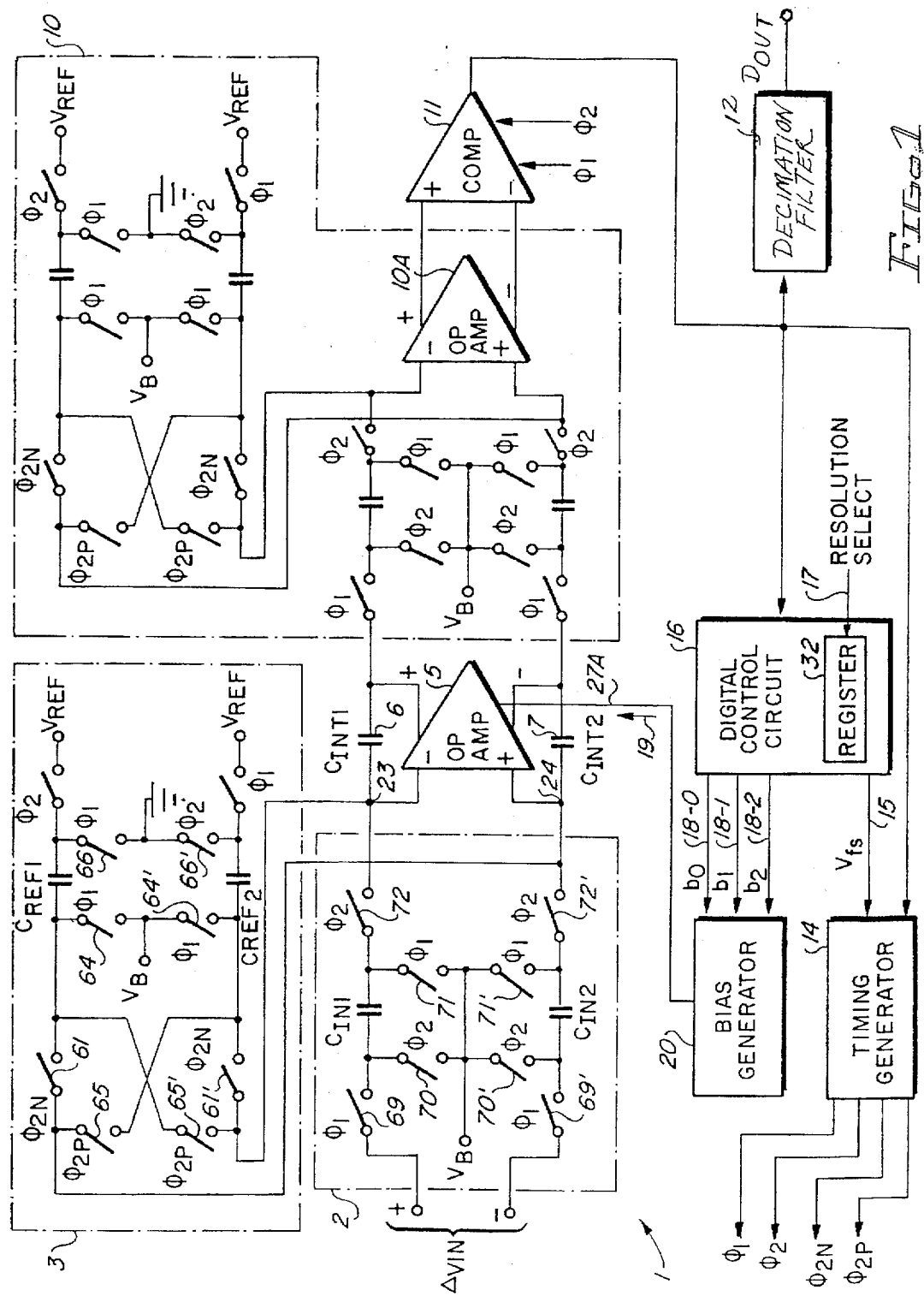
FIG. 1 is a schematic diagram of a delta sigma analog-to-digital converter of the present invention.

Commonly assigned pending application "PROGRAMMABLE GAIN FOR DELTA SIGMA ANALOG-TO-DIGITAL CONVERTER" by Miaochen (nmi) Wu, Timothy V. Kalthoff, and Binan (nmi) Wang, attorney Docket No. 0437-A-169, Ser. No. 08/611,640 filed on Mar. 6, 1996, is incorporated herein by reference. Commonly assigned pending application "SWITCHED CAPACITOR INPUT SAMPLING CIRCUIT AND METHOD FOR DELTA SIGMA MODULATOR" by Timothy V. Kalthoff, Binan (nmi) Wang, and Miaochen (nmi) Wu, attorney Docket No. 0437-A-179, Ser. No. 08/611,329, filed on Mar. 8, 1996, also is incorporated herein by reference.

FIG. 1 identifies the main components of a delta sigma analog-to-digital converter (which is simply an analog-to-digital converter that includes a delta sigma modulator). Delta sigma analog-to-digital converter 1 includes a switched capacitor input sampling circuit 2 which repetitively samples the applied differential analog input signal $\Delta V_{IN}$ at a frequency $f_s$ which determines the frequency of clock signals $\phi_1$ and $\phi_2$. The switched capacitor circuit 2 shown in FIG. 1 is merely one example. The capacitive switching circuit shown in the two above mentioned commonly assigned applications incorporated herein by reference also could be used. The specific details of the structure and operation of these circuits is not essential to understanding the present invention, so such details are not specifically set forth herein.

The value of the sampling capacitors $C_{IN1}$ and $C_{IN2}$ of switched capacitor sampling circuit 2 can be 12 picofarads.

An operational amplifier 5 together with integrating capacitors 6 and 7 (which can each have a capacitance of 110 picofarads), constitutes a differential integrator. Note also that $C_{REF1}$ and $C_{REF2}$ can be 16 picofarads, and $V_{REF}$ can be 2.5 volts, and full scale $\Delta V_{IN}$ can be 5 volts.

Again, the specific details of the integrator do not need to be set forth in detail to enable one skilled in the art to practice the invention. Several more specific examples of integrators are shown and described in detail in the above two commonly assigned patent applications incorporated herein by reference.

A switched capacitor reference feedback voltage sampling circuit 3 repetitively samples $V_{REF}$ in accordance with $\phi_1$ and $\phi_2$ and also in accordance with signals $\phi_{2N}$ and $\phi_{2P}$ which depend upon the decision of a comparator 11 in a way that is entirely conventional for a delta sigma modulator. The details of switched capacitor reference voltage feedback sampling circuit 3 are not important to understanding the present invention and therefore are not set forth. However, details of suitable switched capacitor reference voltage feedback sampling circuits are set forth in detail in the two above identified pending patent applications incorporated herein by reference. A filter 10, which can include a switched capacitor input sampling circuit similar or identical to switched capacitor circuit 2 and a reference feedback voltage sampling circuit that is similar or identical to switched capacitor reference feedback voltage sampling circuit 3, between the outputs of operational amplifier and the inputs of the undisclosed comparator in block 11. The output of comparator 11 is connected to the input of a decimation filter 12 which produces a digital output $D_{OUT}$ that includes a number of binary bits, the binary value of which accurately represent the analog input signal $\Delta V_{IN}$.

The maximum number of bits of the digital output signal $D_{OUT}$ which are capable of precisely representing $\Delta V_{IN}$ is referred to as the "resolution" of the analog-to-digital converter 1. The larger the number of binary bits, the greater the precision with which $D_{OUT}$ can represent $\Delta V_{IN}$, and the higher the "resolution" of $D_{OUT}$.

Because of the bandwidth limitations and signal settling limitations of the various components of analog-to-digital converter 1, especially the bandwidth and signal settling limitations of operational amplifier 5, the resolution increases as the operating frequency or sampling frequency increases. The bandwidth and output signal settling time, and hence the power dissipation of operational amplifier 5 ordinarily are designed so as to permit use of a sampling frequency $f_s$ and an oversampling ratio that correspond to the desired resolution at a specified sampling frequency. The oversampling ratio is the ratio of the frequency at which $\Delta V_{IN}$ is sampled (i.e., the frequency of sampling control signal $V_{fs}$ in FIG. 1) to the frequency or update rate at which new values of $D_{OUT}$ are produced.

Delta sigma analog-to-digital converter 1 further includes a timing generator circuit 14 which generates the clock signals $\phi_1$ and $\phi_2$ in response to an input sampling control signal $V_{fs}$ on conductor 15 having the sampling frequency $f_s$. $\phi_1$ and $\phi_2$ have the same frequency as the sampling signal $f_s$, which in accordance with the present invention can be programmed to have any of the values shown in the right hand portion of Table 1.

The basic sampling frequency control signal $V_{fs}$ is generated by a digital control circuit 16 that includes an internal register 32 which can be programmed in response to digital inputs 17 so as to cause digital control circuit 16 to generate any of the five user-selected frequencies of $f_s$ shown in Table 1.

TABLE 1

| Resolution Control | $b_0$ | $b_1$ | $b_2$ | Bias Current | $f_s$ |
|---|---|---|---|---|---|
| 1 | On | Off | Off | I | 20 KHz |
| 2 | On | Off | Off | I | 40 KHz |
| 4 | On | Off | Off | I | 80 KHz |
| 8 | Off | Off | On | 2I | 160 KHz |
| 16 | On | On | On | 4I | 320 KHz |

In accordance with the present invention, digital control circuit 16 generates three power control or bias current control logic signals $b_0$, $b_1$, and $b_2$ in response to the control information in register 32. $b_0$, $b_1$, and $b_2$ are applied as control inputs to switches 67A,B,C and 68A,B,C, respectively, of a bias generator circuit 20, the details of which are shown in FIG. 2. Depending on the user-selected digital input information input via digital inputs 17 to register 32, bias generator circuit 20 as shown in FIG. 2 can generate any of the integrator operational amplifier bias current values I, 2I, or 4I shown in the "bias current" column of Table 1, to thereby increase the bias current 52 (FIGS. 1 and 2) provided to operational amplifier 5. The larger values of bias current 52 desirably increase the bandwidth and slew rate and reduce settling time of operational amplifier 5 (but also undesirably increase its power dissipation).

Operational amplifier 5 is designed so that when the bias circuit of operational amplifier 5 is I, the output signal of output conductors 30 and 31 of operational amplifier 5 easily settle after the occurrence of each $\phi_2$ pulse and charge transferring between each $C_{REF}$ and the corresponding integrating capacitors. Those skilled in the art will understand that each time feedback charges on $C_{REF1}$ and $C_{REF2}$ are transferred to integrating capacitors $C_{INT1}$ and $C_{INT2}$ as a result of switches 66 and 66' and either switches 61 and 61' or switches 65 and 65' being closed, voltage steps of approximately ±0.35 volts are produced across the integrating capacitors $C_{INT1}$ and $C_{INT2}$, and the operational amplifier 5 must settle from the resulting changes in the output voltages. Similarly, for full scale differential input voltages, each time switches 70 and 70' and switches 72 and 72' are closed, there can be similar voltage steps of approximately ±0.25 volts across the integrating capacitors $C_{INT1}$ and $C_{INT2}$ as a result of charge transferred thereto from $C_{IN1}$ and $C_{IN2}$, respectively. Thus, there can be voltage steps of as much as approximately 1.2 volts which occur every sampling cycle or comparator decision cycle, and operational amplifier 5 must be able to recover and settle from such voltage steps before the beginning of the next cycle at the selected sample frequency $f_s$.

The total operational amplifier settling time is equal to the slew rate settling time followed by a small signal settling time. As the operating frequency is increased, less time is available for such total settling time, and the operational amplifier output pull-up currents and pull-down currents must be increased if shorter settling times are to be achieved to obtain increased resolution as the sampling frequency $f_s$ is increased from 80 kilohertz to 320 kilohertz as indicated in Table 1.

Thus, if higher resolution is required for delta sigma analog-to-digital converter 1, the present invention not only increases the oversampling ratio, and hence the resolution, of delta sigma analog-to-digital converter 1 by increasing the frequency of sampling signal $f_s$ at which $\Delta V_{IN}$ is sampled, but also automatically appropriately increases the bandwidth and decreases the operational amplifier output settling time by increasing the operational amplifier bias current.

Referring to FIG. 2, operational amplifier includes two input terminals 23 and 24 connected, respectively, to the base electrodes N-channel MOSFETs 28 and 22. The drain and source electrodes of MOSFETS 22 and 28 are connected to the drain electrode of cascode n channel MOSFET 42, the source of which is connected to the drain of N-channel MOSFET 35, which is a current mirror output MOSFET having its source electrode connected to ground and its gate electrode connected by conductor 45 to the gate and drain of N-channel current mirror control transistor 27, which has its source electrode connected to ground.

The drain electrode of input MOSFET 22 is connected to the drain electrode of P-channel current mirror output transistor 48 and the source electrode of P-channel cascode MOSFET 50. The gate of cascode MOSFET 50 is connected by conductor 37 to the gate and drain of P-channel current mirror control MOSFET 38, which has its source electrode connected to $V_{DD}$. The source electrode of P-channel MOSFETs 47, 48, and 49 also are connected to $V_{DD}$.

The drain electrode of N-channel MOSFET 28 is connected to the drain of P-channel current mirror output transistor 49 and to the source of P-channel cascode MOSFET 51. The gate of P-channel current mirror output MOSFETs 48 and 49 are connected to conductor 39.

The drain electrodes of cascode MOSFETs 50 and 51 are connected to operational amplifier output conductors 30 and 31 and to the drain electrodes of N-channel cascode MOSFETs 43 and 44. The gates of N-channel cascode MOSFETs 43 and 44 are connected by conductor 40A to the drain of N-channel current mirror control transistor 40, the source by which is connected to ground. The gate of MOSFET 40 is connected to conductor 40A. Conductor 40A also is connected to the gate electrodes of N-channel cascode MOSFETs 36, 41, and 42. The drain electrode of N-channel cascode MOSFET 44 is connected to output conductor 30.

The source electrodes of cascode MOSFETs 43 and 44 are connected to the drain electrodes of N-channel MOSFETs 53 and 54, the source electrodes of which are connected to ground. The gate electrodes of MOSFETs 53 and 54 are connected to common mode feedback voltage conductor 55, which is generated by the circuit 60 shown in FIG. 2.

The conventional common mode feedback circuit 60 shown in FIG. 2 measures the common mode voltage of the output signals produced on conductors 30 and 31 by capacitively averaging the voltages on conductors 30 and 31 and produces a value of common mode feedback signal on conductor 55 as necessary to perform the function of maintaining the common mode voltage of the operational amplifier outputs on conductors 30 and 31 at approximately the midpoint of the range of the voltage swings on conductors 30 and 31.

The current 63 flowing through conductor 40A into the drain of diode-connected (i.e., gate connected to drain) N-channel current mirror control MOSFET 40 is produced by current source circuit 67 in bias generator 20 to perform the function of establishing bias voltages for the various cascode MOSFETs such that the N-channel current mirror output transistor, especially MOSFET 35, always operate in their current saturation modes.

The bias control current 19 flowing through conductor 27A into the drain electrode of N-channel current mirror control transistor 27 is produced by current source circuit 68 in bias generator 20 and establishes whether the bias current 52 flowing through N-channel current mirror output transistor 35, N-channel cascode transistor 42, and the commonly connected source electrodes of input MOSFETs 22 and 28, is I,2I, or 4I, in accordance with the logic signals $b_0$, $b_1$, and $b_2$ as shown in Table 1.

The voltage on the gate electrode of diode-connected current mirror control MOSFET 27 also is applied to the gate electrodes of N-channel current mirror output transistors 29, 34 and 35, all of which have their source electrodes connected to ground. The control current flowing through N-channel current mirror output transistor 29 also flows through N-channel cascode transistor 36 and out of the drain electrode of diode-connected P-channel current mirror control transistor 38, thereby controlling the voltage applied to the gate electrodes of P-channel cascode MOSFETS 46, 50 and 51. The source electrode of P-channel MOSFET 46 is connected to the drain electrode of P-channel MOSFET 47. The drain electrode of MOSFET 46 is connected by conductor 39 to the gate of current mirror control MOSFET 47 and the gate of P-channel current mirror output MOSFETs 48 and 49, so P-channel MOSFET 47 performs the function of establishing the gate voltages of MOSFETs 48 and 49.

Conductor 39 also is connected to the drain electrode of N-channel cascode MOSFET 41, the source of which is connected to the drain electrode of N-channel current mirror output transistor 34. Therefore P-channel current mirror transistors 47, 48, and 49 are controlled "in tandem" with the bias current flowing out of the common source electrodes of source-coupled input transistors 22 and 28.

In an implementation of the above described delta sigma analog-to-digital converter, output noise was low (about 400 ppm) at a 1 kHz output data rate, with $f_s$ equal to 20 kHz, with total analog-to-digital converter bias current equal to about 6 milliamperes, and still lower noise (about 1 ppm) with $f_s$ equal to 320 kHz while maintaining the same data output rate, and total analog-to-digital converter bias current equal to about 9 milliamperes. The described embodiment of the invention achieves this low noise, and hence, high resolution, performance by trading off the improved resolution (i.e., low noise) for dc power dissipation rather than reduced output data rate because as $f_s$ increases, the oversampling ratio of the analog-to-digital converter can be increased without changing the output data rate.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

For example, the bias current of the operational amplifier can be changed by circuitry other than the described switched current sources. Or, the effective MOSFET sizes (i.e., Z/L ratios) of the current mirror output MOSFETs can be programmably changed by connecting/disconnecting parallel portions of such current mirror output MOSFETs.

What is claimed is:

1. In a delta sigma analog-to-digital converter including an input sampling circuit, a feedback reference sampling circuit, an integrator including an operational amplifier, a comparator, and a digital filter, the input sampling circuit and the feedback reference sampling circuit being coupled to a first input of the operational amplifier, an output of the operational amplifier being coupled to an input of the comparator, an output of the comparator being coupled to an input of the digital filter, programmable resolution control circuitry comprising in combination:

(a) a clock generator circuit supplying a clock signal to the input sampling circuit and the feedback reference sampling circuit at a sampling frequency determined by a sampling frequency control signal;

(b) a bias current control circuit supplying a first bias control signal in response to a second bias control signal to the operational amplifier to control the settling time required for an output voltage of the operational amplifier to recover from a voltage step superimposed on the output voltage; and (c) a control circuit receiving a resolution control signal and producing both the sampling frequency control signal and the second bias control signal in response to the resolution control signal, the clock generator circuit operating in response to the sampling frequency control signal to increase the sampling frequency in response to an increase in the resolution control signal, the bias current control circuit operating in response to the first bias control signal to increase the bias current in the operational amplifier in response to an increase in the resolution control signal.

2. In a delta sigma analog-to-digital converter, the programmable resolution control circuitry of claim 1 wherein the clock generator circuit also operates in response to the sampling frequency control signal to decrease the sampling frequency in response to a decrease in the resolution control signal, and the bias current control circuit operates in response to the second bias control signal to decrease bias current in the operational amplifier in response to the decrease in the resolution control signal.

3. In a delta sigma analog-to-digital converter, the programmable resolution control circuitry of claim 2 wherein the integrator includes an integrating capacitor coupled between the input and the output of the operational amplifier, and wherein the input sampling circuit and the feedback reference sampling circuit both are switched capacitor circuits that operate to transfer sampled charge between the integrating capacitor and both the input sampling circuit and the reference sampling circuit and thereby cause the step voltage to be superimposed on the output voltage of the operational amplifier, the bias current control circuit operating in response to the second bias control signal to change the bias current by an amount sufficient to cause the operational amplifier output voltage to recover from the voltage step within a settling time having a predetermined relationship to the sampling frequency.

4. In a delta sigma analog-to-digital converter, the programmable resolution control circuitry of claim 3 wherein the operational amplifier includes first current mirror circuitry producing a pull-down bias current in a differential input stage of the operational amplifier and also producing a control current, and second current mirror circuitry receiving the control current and producing in response thereto a pull-up bias current in a load circuit stage coupled to the differential input stage to decrease settling time of the operational amplifier from either a positive-going or negative-going output voltage step in response to an increase in the resolution control signal.

5. In a delta sigma analog-to-digital converter, the programmable resolution control circuitry of claim 4 wherein the first bias control signal is a bias control current, and wherein the first current mirror circuitry includes an N-channel MOSFET connected as a current mirror control transistor receiving the bias control current and also includes an N-channel first current mirror output MOSFET producing the control current and an N-channel second current mirror output MOSFET producing the pull-down bias current.

6. In a delta sigma analog-to-digital converter, the programmable resolution control circuitry of claim 5 wherein the second current mirror circuitry includes a P-channel MOSFET connected as a current mirror control transistor receiving the control current and also includes a P-channel first current mirror output MOSFET producing the pull-up bias current.

7. In a delta sigma analog-to-digital converter, the programmable resolution control circuitry of claim 6 wherein the second current mirror circuitry also includes a P-channel second current mirror output MOSFET producing the pull-up bias current.

8. In a delta sigma analog-to-digital converter, the programmable resolution control circuitry of claim 2 wherein the resolution control signal is a digital signal and the second bias control signal is a digital signal.

9. An analog-to-digital converter comprising in combination:

(a) an input sampling circuit;

(b) a feedback reference sampling circuit;

(c) an integrator including an operational amplifier, the input sampling circuit and the feedback reference sampling circuit being coupled to a first input of the operational amplifier;

(d) a comparator, an output of the operational amplifier being coupled to an input of the comparator;

(e) a digital filter, an output of the comparator being coupled to an input of the digital filter;

(f) a clock generator circuit supplying a clock signal to the input sampling circuit and the feedback reference sampling circuit at a sampling frequency determined by a sampling frequency control signal;

(g) a bias current control circuit supplying a first bias control signal to the operational amplifier to control the settling time required for an output voltage of the operational amplifier to recover from a voltage step superimposed on the output voltage; and (h) a control circuit receiving a resolution control signal and producing both the sampling frequency control signal and a second bias control signal in response to the resolution control signal, the clock generator circuit operating in response to the sampling frequency control signal to increase the sampling frequency in response to an increase in the resolution control signal, the bias current control circuit operating in response to the first bias control signal to increase bias current in the operational amplifier in response to an increase in the resolution control signal.

10. The analog-to-digital converter of claim 9 wherein the clock generator circuit also operates in response to the sampling frequency control signal to decrease the sampling frequency in response to a decrease in the resolution control signal, and the bias current control circuit operating in response to the second bias control signal to decrease bias current in the operational amplifier in response to a decrease in the resolution control signal.

11. The analog-to-digital converter of claim 10 wherein the integrator includes an integrating capacitor coupled between the input and the output of the operational amplifier, and wherein the input sampling circuit and the feedback reference sampling circuit both are switched capacitor circuits that operate to transfer sampled charge between the integrating capacitor and both the input sampling circuit and the reference sampling circuit and thereby cause the step voltage to be superimposed on the output voltage of the operational amplifier, the bias current control circuit operating in response to the second bias control signal to change the bias current by an amount sufficient to cause the operational amplifier output voltage to recover from the voltage step within a settling time having a predetermined relationship to the sampling frequency.

12. The analog-to-digital converter of claim 11 wherein the operational amplifier includes first current mirror circuitry producing a pull-down bias current in a differential input stage of the operational amplifier and also producing a control current, and second current mirror circuitry receiving the control current and producing in response thereto a pull-up bias current in a load circuit stage coupled to the differential input stage to decrease settling time of the operational amplifier from either a positive-going or negative-going output voltage step in response to an increase in the resolution control signal.

13. The analog-to-digital converter of claim 12 wherein the first bias control signal is a bias control current, and wherein the first current mirror circuitry includes an N-channel MOSFET connected as a current mirror control transistor receiving the bias control current and also includes an N-channel first current mirror output MOSFET producing the control current and an N-channel second current mirror output MOSFET producing the pull-down bias current.

14. The analog-to-digital converter of claim 13 wherein the second current mirror circuitry includes a P-channel MOSFET connected as a current mirror control transistor receiving the control current and also includes a P-channel first current mirror output MOSFET producing the pull-up bias current.

15. The analog-to-digital converter of claim 14 wherein the second current mirror circuitry also includes a P-channel second current mirror output MOSFET producing the pull-up bias current.

16. The analog-to-digital converter of claim 10 wherein the resolution control signal is a digital signal and the second bias control signal is a digital signal.

17. The analog-to-digital converter of claim 9 wherein the analog-to-digital converter is a delta sigma analog-to-digital converter.

18. A method for controlling the resolution of the digital output of an analog-to-digital converter including an input sampling circuit, a feedback reference sampling circuit, an integrator including an operational amplifier, a comparator, and a digital filter, the input sampling circuit and the feedback reference sampling circuit being coupled to a first input of the operational amplifier, an output of the operational amplifier being coupled to an input of the comparator, an output of the comparator being coupled to an input of the digital filter, the method comprising the steps of:

(a) producing a sampling frequency control signal in response to the resolution control signal;

(b) supplying a clock signal to the input sampling circuit and the feedback reference sampling circuit at a sampling frequency in response to the sampling frequency control signal;

(c) supplying a bias control signal to the operational amplifier in response to a resolution control signal to control the settling time required for an output voltage of the operational amplifier to recover from a voltage step superimposed on the output voltage;

(d) increasing the sampling frequency in response to an increase in the resolution control signal; and (e) changing the bias control signal so as to increase the bias current in the operational amplifier in response to the increase in the resolution control signal.

19. In a delta sigma analog-to-digital converter including an input sampling circuit, a feedback reference sampling circuit, an integrator including an operational amplifier, a comparator, and a digital filter, the input sampling circuit and the feedback reference sampling circuit being coupled to a first input of the operational amplifier, an output of the operational amplifier being coupled to an input of the comparator, an output of the comparator being coupled to an input of the digital filter, programmable resolution control circuitry comprising in combination:

(a) a clock generator circuit supplying a clock signal to the input sampling circuit and the feedback reference sampling circuit at a sampling frequency determined by a sampling frequency control signal;

(b) first circuitry supplying a bias control signal to the operational amplifier in response to a resolution control signal to control the settling time required for an output voltage of the operational amplifier to recover from a voltage step superimposed on the output voltage; and (c) second circuitry producing the sampling frequency control signal in response to the resolution control signal, the clock generator circuit operating in response to the sampling frequency control signal to increase the sampling frequency in response to an increase in the resolution control signal, the bias current control circuit operating in response to the bias control signal to increase the bias current in the operational amplifier in response to an increase in the resolution control signal.

20. In a delta sigma analog-to-digital converter, the programmable resolution control circuitry of claim 19 wherein the clock generator circuit also operates in response to the sampling frequency control signal to decrease the sampling frequency in response to a decrease in the resolution control signal, and the first control circuit operates to decrease bias current in the operational amplifier in response to the decrease in the resolution control signal.

* * * * *